(12) United States Patent
Hoteida et al.

(10) Patent No.: US 9,111,839 B2
(45) Date of Patent: Aug. 18, 2015

(54) EPITAXIAL WAFER FOR HETEROJUNCTION TYPE FIELD EFFECT TRANSISTOR

(71) Applicant: Sharp Kabushiki Kaisha, Osaki-shi, Osaka (JP)

(72) Inventors: Masayuki Hoteida, Osaka (JP); Nobuaki Teraguchi, Osaka (JP); Daisuke Honda, Osaka (JP); Nobuyuki Ito, Osaka (JP); Masakazu Matsubayashi, Osaka (JP); Haruhiko Matsukasa, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 14/372,366

(22) PCT Filed: Jan. 15, 2013

(86) PCT No.: PCT/JP2013/050519
§ 371 (c)(1),
(2) Date: Jul. 15, 2014

(87) PCT Pub. No.: WO2013/108733
PCT Pub. Date: Jul. 25, 2013

(65) Prior Publication Data
US 2014/0353587 A1 Dec. 4, 2014

(30) Foreign Application Priority Data

Jan. 16, 2012 (JP) .................................. 2012-005945

(51) Int. Cl.
*H01L 29/06* (2006.01)
*H01L 31/072* (2012.01)
(Continued)

(52) U.S. Cl.
CPC .......... *H01L 29/152* (2013.01); *H01L 21/0254* (2013.01); *H01L 21/0262* (2013.01);
(Continued)

(58) Field of Classification Search
CPC . H01L 29/152; H01L 29/2003; H01L 29/205; H01L 29/7787; H01L 29/155; H01L 21/02381; H01L 21/02458; H01L 21/02507; H01L 21/0254; H01L 21/0262
USPC ............... 257/12, 15, 22, 183, 185, 187, 190, 257/191, 192
See application file for complete search history.

(56) References Cited

U.S. PATENT DOCUMENTS 7,456,442 B2 * 11/2008 Munns .......................... 257/190
8,530,935 B2 * 9/2013 Yanagihara ................... 257/190
(Continued)

FOREIGN PATENT DOCUMENTS

| JP | 2007-67077 A | 3/2007 |
| JP | 2009-158804 A | 7/2009 |
| JP | 2010-232377 A | 10/2010 |

*Primary Examiner* — Hung Vu
(74) *Attorney, Agent, or Firm* — Birch, Stewart, Kolasch & Birch, LLP

(57) ABSTRACT

An epitaxial wafer for a heterojunction type FET includes an AlN primary layer, a stepwisely composition-graded buffer layer structure, a superlattice buffer layer structure, a GaN channel layer, and a nitride semiconductor electron supply layer, which are sequentially provided on a Si substrate, the stepwisely composition-graded buffer layer structure including a plurality of AlGaN buffer layers provided on each other such that an Al composition ratio is sequentially reduced, an uppermost layer thereof having a composition of $Al_xGa_{1-x}N$ ($0<x$), a plurality of sets of an $Al_yGa_{1-y}N$ ($y \leq 1$) superlattice constituting layer and an $Al_zGa_{1-z}N$ ($0<z<y$) superlattice constituting layer being provided on each other alternately starting from one of the $Al_yGa_{1-y}N$ superlattice constituting layer and the $Al_zGa_{1-z}N$ superlattice constituting layer in the superlattice buffer layer structure, the $Al_xGa_{1-x}N$ buffer layer and the $Al_zGa_{1-z}N$ superlattice constituting layer satisfying $x-0.05 \leq z \leq x+0.05$.

2 Claims, 2 Drawing Sheets

(51) Int. Cl.
    *H01L 29/15*      (2006.01)
    *H01L 21/02*      (2006.01)
    *H01L 29/778*     (2006.01)
    *H01L 29/20*      (2006.01)
    *H01L 29/205*     (2006.01)
(52) U.S. Cl.
    CPC .... *H01L21/02381* (2013.01); *H01L 21/02458* (2013.01); *H01L 21/02507* (2013.01); *H01L 29/155* (2013.01); *H01L 29/2003* (2013.01); *H01L 29/205* (2013.01); *H01L 29/7787* (2013.01)

(56) References Cited

U.S. PATENT DOCUMENTS

| 2010/0243989 | A1 | 9/2010 | Makabe et al. | |
|---|---|---|---|---|
| 2011/0001127 | A1 | 1/2011 | Sakamoto et al. | |
| 2011/0006346 | A1* | 1/2011 | Ando et al. | 257/192 |

* cited by examiner

EPITAXIAL WAFER FOR HETEROJUNCTION TYPE FIELD EFFECT TRANSISTOR

TECHNICAL FIELD

The present invention relates to an epitaxial wafer for fabricating a heterojunction type field effect transistor including a plurality of nitride-based semiconductor layers capable of generating two-dimensional electron gas (2DEG), in particular, reduction of warpage and dislocation density in the wafer.

BACKGROUND ART

In formation of a heterojunction structure formed of nitride-based semiconductors such as AlGaN layer/GaN layer, these layers have been conventionally formed through epitaxial crystal growth onto a sapphire substrate or a Si substrate because a GaN substrate is expensive.

Regarding crystal growth of a nitride-based semiconductor layer on a Si substrate, various buffer layer structures have been contemplated to relax a strain that is based on a crystal structure difference of the nitride-based semiconductor layer from the Si substrate, lattice mismatch therebetween, a thermal expansion coefficient difference therebetween, and the like. More specifically, there are many patent publications in relation to a superlattice buffer layer structure including repetition of two types of superlattice constituting layers.

For example, in order to form a nitride semiconductor layer, which has a smooth surface and includes no crack, on a substrate greatly different therefrom in terms of lattice constant and thermal expansion coefficient, Patent Document 1 describes that an AlGaN-based superlattice buffer layer structure is formed by repeatedly and alternately providing first superlattice constituting layers of $Al_xGa_{1-x}N$ ($0.5 \leq x \leq 1$) and second superlattice constituting layers of $Al_yGa_{1-y}N$ ($0.01 \leq y \leq 0.2$) on the silicon substrate.

On the other hand, in order to suppress current leakage between electrodes via a buffer layer, Patent Document 2 describes a semiconductor element having: an AlN buffer layer on a silicon substrate; and a superlattice buffer layer structure including H—AlGaN superlattice constituting layers of high Al composition ratio and L-AlGaN superlattice constituting layers of low Al composition ratio, which are alternately provided thereon.

Moreover, in Patent Document 3, a composition-graded buffer layer structure is formed on a Si substrate or an intermediate layer formed thereon, a superlattice buffer layer structure is then formed thereon, and then a nitride layer to serve as a channel layer is formed thereon. The composition-graded buffer layer structure has an Al composition ratio continuously or stepwisely decreased in the thickness direction. The superlattice buffer layer structure includes AlGaN superlattice constituting layers of high Al composition ratio and AlGaN superlattice constituting layers of low Al composition ratio, which are alternately provided on each other. It is described that by employing such a lamination structure, there is obtained a semiconductor element having a nitride semiconductor layer that is less likely to have crack and pit generated therein and that has excellent crystallinity.

CITATION LIST

Patent Document

PTD 1: Japanese Patent Laying-Open No. 2007-67077
PTD 2: Japanese Patent Laying-Open No. 2010-232377
PTD 3: Japanese Patent Laying-Open No. 2009-158804

SUMMARY OF INVENTION

Technical Problem

It is described or suggested that the nitride-based semiconductor epitaxial wafer disclosed in each of Patent Documents 1 to 3 can be used as a wafer for a power device, which is an electronic device. However, in order to manufacture a power device using such an epitaxial wafer, semiconductor processes needs to be performed such as electrode formation, device isolation, surface protection film formation, internal interconnection formation, and the like by means of photolithography, etching, and other steps for the wafer. Hence, if the wafer has a warpage, yield of devices will be decreased. If the warpage is severe, the wafer cannot be processed by a semiconductor manufacturing apparatus, disadvantageously. In particular, for a power device required to achieve a breakdown voltage of 600 V to 1200 V, the film thickness of the nitride semiconductor layer itself needs to be increased, and as the film thickness is increased, the warpage of the wafer tends to become larger.

Due to such a problem in warpage of the wafer, no epitaxial wafer suitable for manufacturing power devices has come onto the market yet.

In view of the foregoing problem of the prior art, the present invention has an object to reduce warpage and edge dislocation density in an epitaxial wafer for a heterojunction type FET by adjusting a relation between a stepwisely composition-graded buffer layer structure and a superlattice buffer layer structure provided thereon.

Solution To Problem

According to the present invention, an epitaxial wafer for a heterojunction type field effect transistor includes an AlN primary layer, a stepwisely composition-graded buffer layer structure, a superlattice buffer layer structure, a GaN channel layer, and a nitride-based semiconductor electron supply layer, which are sequentially provided on a Si substrate, the stepwisely composition-graded buffer layer structure including a plurality of AlGaN buffer layers provided on each other such that an Al composition ratio is stepwisely and sequentially reduced, an uppermost AlGaN buffer layer having a composition of $Al_xGa_{1-x}N$ ($0<x$), a plurality of sets of an $Al_yGa_{1-y}N$ ($y \leq 1$) superlattice constituting layer and an $Al_zGa_{1-z}N$ ($0<z<y$) superlattice constituting layer being provided on each other alternately starting from one of the $Al_yGa_{1-y}N$ superlattice constituting layer and the $Al_zGa_{1-z}N$ superlattice constituting layer in the superlattice buffer layer structure, the $Al_xGa_{1-x}N$ buffer layer and the $Al_zGa_{1-z}N$ superlattice constituting layer having substantially the same Al composition ratio and satisfying $x-0.05<z<x+0.05$.

It should be noted that a lowermost superlattice constituting layer in the superlattice buffer layer structure preferably has a composition of AlN.

Advantageous Effects of Invention

By using the above-described combination of the stepwisely composition-graded buffer layer structure and the superlattice buffer layer structure in the present invention, the warpage of the nitride-based semiconductor epitaxial wafer can be reduced significantly and the nitride-based semiconductor epitaxial wafer having a reduced edge dislocation density can be also obtained.

DESCRIPTION OF EMBODIMENTS

In order to determine a desired relation between a stepwisely composition-graded buffer layer structure and a superlattice buffer layer structure to reduce warpage and edge dislocation density in an epitaxial wafer for a heterojunction type FET, the present inventors have arrived at the present invention by measuring amount of warpage and edge dislocation density in a wafer in each of below-described example and comparative examples and reviewing the result thereof

Example 1

Figure 1:
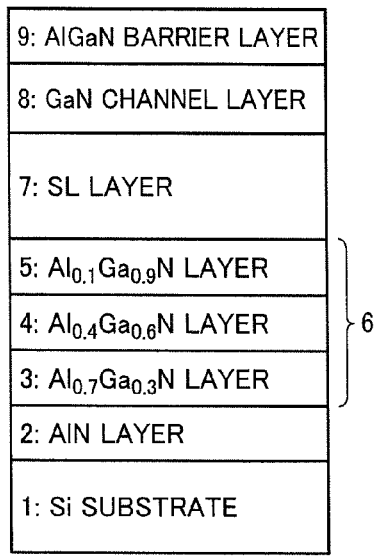
FIG. 1 is a schematic cross sectional view showing a lamination structure in a nitride-based semiconductor epitaxial wafer according to an example 1 of the present invention.

FIG. 1 is a schematic cross sectional view showing a lamination structure in an epitaxial wafer for a heterojunction type FET according to an example 1 of the present invention.

For fabrication of this wafer in FIG. 1, a Si substrate 1 having a diameter of 4 inches and a thickness of 625 μm was used. Prior to crystal growth of nitride-based semiconductor layers, a surface oxide film of Si substrate 1 was removed using a hydrofluoric acid based etchant, and then the substrate was set in an MOCVD (metalorganic chemical vapor deposition) apparatus. In the MOCVD apparatus, the substrate was heated to 1100° C., and then the surface of the substrate was cleaned under a hydrogen atmosphere at a chamber internal pressure of 13.3 kPa. Thereafter, while maintaining the substrate temperature and the chamber internal pressure, ammonia NH3 (12.5 slm) was flown, thereby nitriding the surface of the Si substrate.

After nitriding the surface of the Si substrate, an AlN primary layer 2 having a thickness of 200 nm was deposited under the conditions that TMA (trimethylaluminum) flow rate=117 μmol/min and NH3 flow rate=12.5 slm.

Thereafter, the substrate temperature was increased to 1150° C., and a stepwisely composition-graded buffer layer structure 6 was formed under the following conditions. That is, an Al0.7Ga0.3N layer 3 having a thickness of 200 nm was deposited under conditions that TMG (trimethylgallium) flow rate=57 μmol/min, TMA flow rate=97 μmol/min, and NH3 flow rate=12.5 slm. Then, an Al0.4Ga0.6N layer 4 having a thickness of 400 nm was deposited under conditions that TMG flow rate=99 μmol/min, TMA flow rate=55 μmol/min, and NH3 flow rate=12.5 slm. Further, an Al0.1Ga0.9N layer 5 having a thickness of 400 nm was deposited under conditions that TMG flow rate=137 μmol/min, TMA flow rate=18 μmol/min, and NH3 flow rate=12.5 slm. In this way, stepwisely composition-graded buffer layer structure 6 was formed.

Thereafter, while maintaining the substrate temperature at 1150° C., 70 cycles of an AlN superlattice constituting layer having a thickness of 10 nm and an Al0.1Ga0.9N superlattice constituting layer having a thickness of 20 nm were provided, thereby forming a superlattice (SL) buffer layer structure 7 having a thickness of 2.1 μm. In doing so, the AlN superlattice constituting layer was deposited under conditions that TMA flow rate=102 μmol/min and NH3 flow rate=12.5 slm, and the Al0.1Ga0.9N superlattice constituting layer was deposited under conditions that TMG flow rate=720 μmol/min, TMA flow rate=80 μmol/min, and NH3 flow rate=12.5 slm.

Thereafter, the substrate temperature was decreased to 1100° C., and then a GaN channel layer 8 of 1000 nm was deposited under conditions that TMG flow rate=224 μmol/min and NH3 flow rate=12.5 slm.

It should be noted that single GaN channel layer 8 was deposited in example 1, but there may be formed a two-layer structure channel layer including a GaN layer deposited under a relatively low reactive gas pressure and having a thickness of 0.3 μm and a GaN layer deposited under a relatively high reactive gas pressure and having a thickness of 0.7 μm in order to improve the breakdown voltage of an FET to be formed. In this case, the breakdown voltage of the FET is improved by employing such a tendency that the GaN channel layer is likely to be doped with carbon contained in the TMG when the reactive gas pressure is low whereas the GaN channel layer is unlikely to be doped with carbon when the reactive gas pressure is high.

On GaN channel layer 8, an electron supply layer constructed of an Al0.2Ga0.8N barrier layer 9 (having a thickness of 20 nm) was deposited at a pressure of 13.3 kPa under the conditions that TMG flow rate=46 μmol/min, TMA flow rate=7 μmol/min, and NH3 flow rate=12.5 slm.

It should be noted that the electron supply layer may be configured such that a very thin AlN property improving layer (having a thickness of 1 nm) is added between GaN channel layer 8 and Al0.2Ga0.8N barrier layer 9 to increase the 2DEG concentration in the GaN channel layer, or a GaN cap layer (having a thickness of 1 nm) is preferably provided on the surface of Al0.2Ga0.8N barrier layer 9 for the purpose of protection thereof

Comparative Example 1

Figure 2:
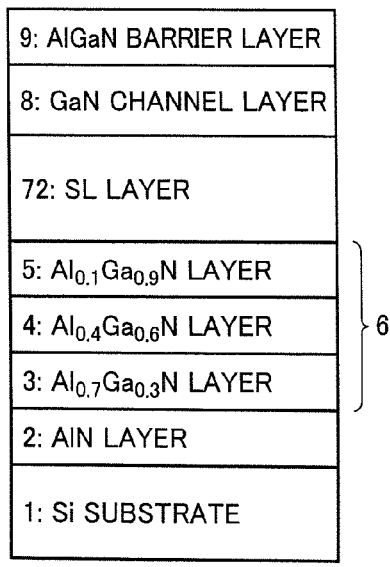
FIG. 2 is a schematic cross sectional view showing a lamination structure in a nitride-based semiconductor epitaxial wafer according to a comparative example 1.

FIG. 2 is a schematic cross sectional view showing a lamination structure in an epitaxial wafer for a heterojunction type FET according to a comparative example 1.

In the fabrication of the wafer in FIG. 2, layers other than the layers included in superlattice (SL) buffer layer structure 72 were deposited under the same conditions as those in example 1.

In the formation of superlattice buffer layer structure 72 of comparative example 1, with the substrate temperature being set at 1150° C., 70 cycles of an AlN superlattice constituting layer having a thickness of 10 nm and a GaN superlattice constituting layer having a thickness of 20 nm were provided. In doing so, the AlN superlattice constituting layer was deposited under conditions that TMA flow rate=102 μmol/min and NH3 flow rate=12.5 slm, and the GaN layer was deposited under conditions that TMG flow rate=800 μmol/min and NH3 flow rate=12.5 slm.

Thereafter, as with example 1, GaN channel layer 8 (having a thickness of 1000 nm) and the electron supply layer constructed of Al0.2Ga0.8N barrier layer 9 (having a thickness of 20 nm) were deposited.

Comparative Example 2

Figure 3:
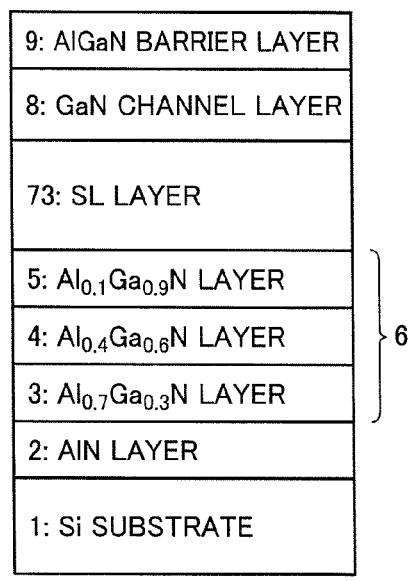
FIG. 3 is a schematic cross sectional view showing a lamination structure in a nitride-based semiconductor epitaxial wafer according to a comparative example 2.

FIG. 3 is a schematic cross sectional view showing a lamination structure in an epitaxial wafer for a heterojunction type FET according to a comparative example 2.

In the fabrication of the wafer in FIG. 3, layers other than the layers included in superlattice (SL) buffer layer structure 73 were deposited under the same conditions as those in example 1.

In the formation of superlattice buffer layer structure 73 of comparative example 2, with the substrate temperature being set at 1150° C., 70 cycles of an AlN superlattice constituting layer having a thickness of 10 nm and an Al0.2Ga0.8N superlattice constituting layer having a thickness of 20 nm were provided. In doing so, the AlN superlattice constituting layer was deposited under conditions that TMA flow rate=102 μmol/min and NH3 flow rate=12.5 slm, and the Al0.2Ga0.8N superlattice constituting layer was deposited under conditions that TMG flow rate=640 μmol/min, TMA flow rate=160 μmol/min, and NH3 flow rate=12.5 slm.

Thereafter, as with example 1, GaN channel layer 8 (having a thickness of 1000 nm) and the electron supply layer constructed of Al0.2Ga0.8N barrier layer 9 (having a thickness of 20 nm) were deposited.

Evaluation and Review

Warpage and edge dislocation density were evaluated with regard to the epitaxial wafers in the above-described example and comparative examples.

It should be noted that the warpage of each wafer having a diameter of 4 inches was measured assuming that an amount of warpage at a central portion of a downward projection was positive in value. Moreover, the edge dislocation density was measured as dislocation density in GaN channel layer 8. More specifically, the edge dislocation density was estimated based on the following empirical formula (1), which employs the full width at half maximum (FWHM) of a (1-100) plane diffraction peak in a rocking curve obtained by an X-ray diffraction measurement:

$$\text{Edge dislocation density} = (\text{FWHM}^2/9.0)/3.189 \text{ Å}^2 \quad (1)$$

Here, the FWHM and the edge dislocation density were related to each other by observation through cathode luminescence (CL). The numerical value "9.0" in the formula (1) is a fitting parameter for relating the FWHM and the edge dislocation density to each other based on the CL observation, and 3.189 Å represents the length of the Burgers vector of the edge dislocation in the GaN crystal.

Based on example 1 and comparative examples 1 and 2 described above, the graph of FIG. 4 shows the warpage (μm) of the epitaxial wafer, which is dependent on an Al composition difference (%) of the uppermost layer in the stepwisely composition-graded buffer layer structure from the superlattice constituting layer having a relatively small band gap (small Al composition ratio) in the superlattice buffer layer structure.

Figure 4:
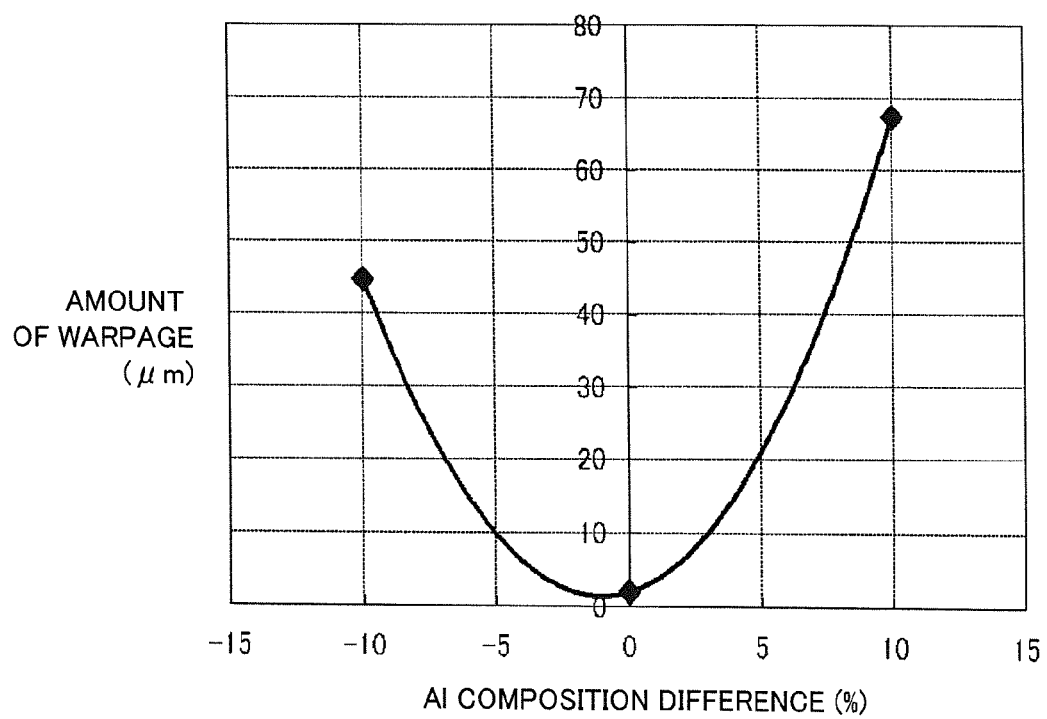
FIG. 4 is a graph showing an amount of warpage (μm) of the epitaxial wafer, which is dependent on an Al composition difference (%) of a superlattice constituting layer having a relatively small band gap in a superlattice buffer layer structure from an uppermost layer in a stepwisely composition-graded buffer layer structure.

In other words, in the case where the composition of the uppermost layer in the stepwisely composition-graded buffer layer structure was $Al_xGa_{1-x}N$ (0<x), the composition of the superlattice constituting layer having a relatively large band gap in the superlattice buffer layer structure was $Al_yGa_{1-y}N$ (y≤1), and the composition of the superlattice constituting layer having a relatively small band gap was $Al_zGa_{1-z}N$ (0<z<y), the horizontal axis of the graph of FIG. 4 represents (z-x)×100%.

As shown in this graph, in example 1, the Al composition difference of the uppermost layer in stepwisely composition-graded buffer layer structure 6, i.e., Al0.1Ga0.9N layer 5 from the Al0.1Ga0.9N superlattice constituting layer having a small band gap in superlattice buffer layer structure 7 was 0%. In this case, the amount of warpage of the wafer was 2.0 μm. Further, the wafer had an edge dislocation density of 2.44× 109 cm−2.

On the other hand, in comparative example 1, the Al composition difference of the uppermost layer in stepwisely composition-graded buffer layer structure 6, i.e., Al0.1Ga0.9N layer 5 from the GaN superlattice constituting layer having a small band gap in superlattice buffer layer structure 72 was −10%. In this case, the amount of warpage of the wafer was 44.8 μm. Further, the wafer had an edge dislocation density of 6.15×109 cm−2.

Further, in comparative example 2, the Al composition difference of the uppermost layer in stepwisely composition-graded buffer layer structure 6, i.e., Al0.1Ga0.9N layer 5 from the Al0.2Ga0.8N superlattice constituting layer having a small band gap in superlattice buffer layer structure 73 was +10%. In this case, the amount of warpage of the wafer was 67.4 μm. Further, the wafer had an edge dislocation density of 3.45×109 cm−2.

From the above result, it is understood that as the Al composition difference (%) is smaller between the superlattice constituting layer having a small Al composition ratio in the superlattice buffer layer structure and the uppermost layer in the stepwisely composition-graded buffer layer structure, both the warpage and the edge dislocation density are significantly decreased in the epitaxial wafer.

Here, when the warpage of the epitaxial wafer is equal to or less than 20 μm, the wafer can be readily handled in the semiconductor manufacturing process, for example, a small GaN-based power device with a low on-resistance can be readily fabricated. Hence, with the composition ratio difference falling within a range of −0.05≤z−x≤0.05, the epitaxial wafer can be used as a practical epitaxial wafer.

It should be noted that in each of the example and comparative examples described above, Al0.1Ga0.9N layer 5 was used as the uppermost layer in stepwisely composition-graded buffer layer structure 6, but a tendency similar to that in FIG. 4 was confirmed also when an Al0.2Ga0.8N layer was used as the uppermost layer.

The above result was obtained presumably in relation to the following matter. First, in the case where a GaN channel layer having a relatively large thickness is epitaxially grown directly on a Si substrate, the GaN layer, which has a larger thermal expansion coefficient than that of the Si substrate, is larger in a degree of cooling shrinkage than the Si substrate when cooling the wafer from the high temperature state for the epitaxial growth to the room temperature. Hence, the upper surface of the Si substrate receives compressive force from the GaN layer (the GaN layer receives pulling force from the Si substrate), with the result that the entire wafer is warped to project downward.

Under such a circumstance, the GaN layer is successively provided with compressive force by the stepwisely composition-graded buffer layer structure through the strain resulting from the lattice constant difference, thereby reducing the warpage of the entire wafer projecting downward. It should be noted that the AlGaN layer has a lattice constant intermediate between those of the GaN layer and the AlN layer.

Further, because the Al composition of the superlattice constituting layer having a smaller band gap in the superlattice buffer layer structure is made substantially the same as the Al composition in the uppermost layer in the graded buffer layer, it is considered that the strain between the superlattice buffer layer structure and the stepwisely graded buffer layer structure can be minimized, thereby minimizing the warpage in the wafer.

It should be noted that when the epitaxial wafer of the present invention is used to fabricate a FET having a high breakdown voltage, the superlattice buffer layer structure preferably includes an AlN superlattice constituting layer having a band gap as large as possible.

INDUSTRIAL APPLICABILITY

As described above, by using the combination of the stepwisely composition-graded buffer layer structure and the superlattice buffer layer structure in the present invention, the warpage of the nitride-based semiconductor epitaxial wafer can be reduced significantly and the nitride-based semiconductor epitaxial wafer having a reduced edge dislocation density can be also provided.

REFERENCE SIGNS LIST

1: Si substrate; 2: AlN primary layer; 3: $Al_{0.7}Ga_{0.3}N$ buffer layer; 4: $Al_{0.4}Ga_{0.6}N$ buffer layer; 5: $Al_{0.1}Ga_{0.9}N$ buffer layer; 6: stepwisely composition-graded buffer layer structure; 7, 72, 73: superlattice buffer layer structure; 8: GaN channel layer; 9: $Al_{0.2}Ga_{0.8}N$ barrier layer.

The invention claimed is:

1. An epitaxial wafer for a heterojunction type field effect transistor, comprising an AlN primary layer, a stepwisely composition-graded buffer layer structure, a superlattice buffer layer structure, a GaN channel layer, and a nitride-based semiconductor electron supply layer, which are sequentially provided on a Si substrate, said stepwisely composition-graded buffer layer structure including a plurality of AlGaN buffer layers provided on each other such that an Al composition ratio is stepwisely and sequentially reduced, an uppermost AlGaN buffer layer having a composition of $Al_xGa_{1-x}N$ (0<x), a plurality of sets of an $Al_yGa_{1-y}N$ (y≤1) superlattice constituting layer and an $Al_zGa_{1-z}N$ (0<z<y) superlattice constituting layer being provided on each other alternately starting from one of said $Al_yGa_{1-y}N$ superlattice constituting layer and said $Al_zGa_{1-z}N$ superlattice constituting layer in said superlattice buffer layer structure, said $Al_xGa_{1-x}N$ buffer layer and said $Al_zGa_{1-z}N$ superlattice constituting layer having substantially the same Al composition ratio and satisfying x−0.05≤z≤x+0.05, an Al composition difference of the uppermost $Al_xGa_{1-x}N$ layer (0<x) in said stepwisely composition-graded buffer layer structure from the $Al_yGa_{1-y}N$ (y≤1) superlattice constituting layer having a small band gap in said superlattice buffer layer structure being 0%.

2. The epitaxial wafer according to claim 1, wherein a lowermost superlattice constituting layer in said superlattice buffer layer structure has a composition of AlN.

* * * * *